United States Patent [19]
Cobb

[11] Patent Number: 5,187,671
[45] Date of Patent: Feb. 16, 1993

[54] AUTOMATED INTERCONNECT ROUTING SYSTEM

[75] Inventor: Deborah D. Cobb, Austin, Tex.

[73] Assignee: Microelectronics and Computer Technology Corporation, Austin, Tex.

[21] Appl. No.: 572,744

[22] Filed: Aug. 24, 1990

[51] Int. Cl.$^5$ .............................................. G06F 15/60
[52] U.S. Cl. ................................... 364/490; 364/489; 364/488
[58] Field of Search ................. 364/491, 490, 489, 488

[56] References Cited

U.S. PATENT DOCUMENTS

| | | | |
|---|---|---|---|
| T 944,001 | 3/1970 | Hanan et al. | 364/490 |
| 4,593,363 | 6/1986 | Burstein et al. | 364/491 |
| 4,815,003 | 3/1989 | Putatunda et al. | 364/491 |
| 4,890,238 | 12/1989 | Klein et al. | 364/491 |
| 4,908,772 | 3/1990 | Chi | 364/491 |
| 4,922,432 | 5/1990 | Kobayashi et al. | 364/490 |
| 4,967,367 | 10/1990 | Piednoir | 364/489 |

OTHER PUBLICATIONS

"Partitioning and Placement Technique for CMOS Gate Arrays" by G. Odawara et al., IEEE Trans. on Computer-Aided Design of Integrated Circuits and Systems, CAD 6, No. 3, May 1987, pp. 355-363.

"An Efficient Heuristic Procedure for Partitioning Graphs" by B. W. Kernighan et al., The Bell System Technical Journal, Feb. 1970, pp. 291-307.

Murphy, Daniel, "Maintaining Balance in Complex Board Design, PCB Design", pp. 77-83 (Oct. 1989).

Bently, Jon, "Multidimensional Binary Search Trees Used for Associative Searching, Communications of the ACM", vol. 18, No. 9, pp. 509-517 (Sep. 1975).

Rosenberg, Jonathan, "Geographical Data Structures Compared: A Study of Data Structures Supporting Region Queries", IEEEI Transactions on Computer-Aided Design, vol. CAD-4, No. 1, pp. 53-67 (Jan. 1985).

Suzuki, Kei, et al., "A Gridless Router: Software and Hardware Implementations," International Federation for Information Processing, VLSI 1987 Proceedings.

Kaplan, David, "Routing With a Scanning Window-A Unified Approach", 24th ACM/IEEE Design Automation Conference, pp. 629-632 (1987).

Hu, T. C. et al., "A Decomposition Algorithm for Circuit Routing", VLSI Circuit Layout: Theory and Design, pp. 144-152, IEEE Press (1985).

Hightower, David, "The Interconnection Problem-A Tutorial", Proceedings of Design Automation Workshop, pp. 1-21 (1973).

Smith, Lyle Richard, "An Analysis of Area Routing", Ph.D. Dissentation-Department of Electrical Engineering Stanford University (Feb. 1983).

Dion, Jeremy, "Fast Printed Circuit Board Routing", Proceedings of the 24th ACM/IEEE Design Automation Conference, pp. 727-734 (1987).

Primary Examiner—Vincent N. Trans
Attorney, Agent, or Firm—Fulbright & Jaworski

[57] ABSTRACT

A method of manufacturing a multiple element circuit interconnect substrate is provided which provides an optimized routing plan. The routing plan is based upon a multi-dimensional binary data structure having nodes representing each terminal interconnect requirement which is preprocessed to order the required interconnects according to density.

6 Claims, 10 Drawing Sheets
Microfiche Appendix Included
(4 Microfiche, 320 Pages)

PRIOR ART DATA STRUCTURE

Routing Region

AUTOMATED INTERCONNECT ROUTING SYSTEM

BACKGROUND OF THE INVENTION

Microfiche Appendix

Portions of the specification of this application including computer program listings have been submitted as a microfiche appendix, including 4 microfiche films with a total of 320 frames.

1. Field of the Invention

The present invention relates to methods of routing electrical circuit interconnections for multiple circuit substrate devices such as interconnect substrates for integrated circuit packages, complex printed circuit boards or like multiple interconnect devices used to adapt mass produced, multiple element circuitry to custom applications.

2. Discussion of the Related Art

As the complexity of miniaturized multiple element circuits has increased, designers have had continually increasing difficulty in developing routing patterns for printed circuit boards or integrated circuit interconnect substrates to support them. Furthermore, as circuit density and miniaturization increase, the relative electromagnetic effects imposed by interconnect layouts have become increasingly more critical.

Studies have shown that the typical routing efficiency for printed circuit boards using prior art techniques is approximately sixty percent, a figure representing the connection length divided by the overall available trace length. It has also been shown that typical prior art routing techniques for printed circuit boards produce a routing map that is heavily concentrated in the center, about ninety percent efficient, the outer third lightly loaded (about thirty percent) and the intermediate third is typically about sixty percent loaded. See D. Murphy, "Maintaining Balance", *High Performance Systems*, October 1989. Traditionally, routing designers focused on minimizing overall connection length, bends and the number of layer and direction changes. In some systems, the interconnect lengths are deliberately lengthened to meet circuit timing requirements, and other factors such as overall net length and circuit proximity have to be considered.

In complex systems, such as those involving hundreds or thousands of circuit elements, routing designs can require days of computer processing (CPU) time to arrive at a satisfactory solution. The typical analysis may go through thousands of iterations, starting in one area and expanding, often having to resequence or rip-up previously routed portions and retry. Current technology commonly requires up to ten thousand interconnections per circuit board.

Routing methods can be evaluated based upon the length of computer time it takes to achieve one hundred percent routing, the overall grid or network length utilized, the resource utilization ratio and other factors. It has been shown that while it is relatively easy to route the first ninety percent of interconnections, it is extremely difficult to successfully route the last two to three percent. Good routing methods therefore are most critical where the routing will require very dense interconnections.

Circuit board interconnect requirements are typically described by reference to trace interconnects, with a two dimensional basis. For example, a first layer of circuit traces or conductors are arranged in parallel running in a first direction, designated the "X" direction. A second set of parallel conductors in a second layer run in the "Y" direction, orthogonal to the "X" conductors. Interconnection is then designated by reference to certain X and Y conductors which are the termination points of the interconnect requirement, i.e., $X_1$-$Y_1$, $X_1$-$Y_2$, $X_3$-$Y_2$, etc. In geometrically arranged substrates, the X, Y designations can be viewed as corresponding to cartesian coordinates, with the $X_1$, $Y_1$ trace intersection being in the lower left hand corner when the two parallel planer substrates are viewed from a position on a line perpendicular to the plane of the substrates. One such particularly efficient multiple-layer integrated circuit interconnect structure is disclosed in U.S. patent application Ser. No. 102,172, filed on Sep. 29, 1987 and assigned to Microelectronics and Computer Technology Corporation, the assignee of the present application. The contents of that patent application are incorporated by reference herein. In this type of interconnect, the "X" and "Y" conductors correspond to separate layers of parallel, segmented conductors. A third layer lying above the X and Y layers forms the customization layer. The customization layer is utilized to customize an interconnect to meet custom circuit requirements by providing a means for specificying electrical connections between the "X" and "Y" conductors, as well as between various other interconnect elements such as voltage planes.

Whether a two-dimensional or multi-dimensional configuration is utilized, if each interconnect requirement is specified by reference to required termination point connections, i.e., $X_1$-$Y_2$, it is possible to represent the interconnection requirement by a set of records forming a data base. Each record has two attributes, $X_N$, $Y_N$, and records can be stored and retrieved based on these attributes. Additional data such as a net number can be associated with each data file as necessary for the particular method being implemented. It has also been shown that data files of this type can be represented by a two-dimensional tree, where each record can be stored as a node in the tree. See, for example, Bentley, "Multidimensional Binary Search Trees Used for Associative Searching," *Communications of the ACM*, Vol. 18, No. 9, September 1975. In these types of data structures, each node has two pointers which are either null or point to another node. Also associated with each node is a discriminator, which in two-dimensional trees is either 0 or 1. In the language of this art, one pointer is designated LOSON and the other HISON. FIG. 1 is a simplified planar graph of a two-dimensional record tree, where LOSON's are expressed by left branches and HISON's are expressed by right branches, and Null's are expressed by boxes. The defining order imposed by a two-dimensional data tree is: for any node P, let zero be the discriminator for P, then for any node Q in LOSON(P), it is true that $X(Q)<X(P)$; if the discriminator is 1, then $Y(Q)<Y(P)$ for all nodes Q in LOSON(P). Similarly, for any node R in HISON(P), if the discriminator is zero, then $X(R)>X(P)$.

By utilizing this type of data structure, and by further defining a method to determine the relative values of records (nodes) having equal X or Y dimensions it has been shown to be possible to determine maximum and minimum distances between nodes. It has also been shown that this type of data structure can be utilized to determine if a specified record, i.e., interconnect, is already in the tree, and if not, to insert it at the appropriate place using an insertion algorithm. See, for example, Bentley, "Multidimensional Binary Search Trees Used for Associative Searching," *Communications of the ACM,* Vol. 18, No. 9, September 1975.

Prior art methods of routing have taken a number of approaches to ordering the FROM-TO connections with the goal of improving routing efficiency. Some have focused on ordering the connections by length, i.e., short-routed first, long-routed last. Others have ordered the connections based upon straightness or a congestion determined by heuristics. Some prior art ordering methods arbitrarily divided the area to be routed into a number of windows and imposed a grading system to order the connections within each window independently of the remainder of the problem. See, for example, D. Kaplan, "Routing With a Scanning Window-A Unified Approach," *24th ACM/IEEE Design Automation Conference,* pp. 629-632 (1987).

Others have attempted to apply a two-dimensional binary tree approach to partition the problem in a top-to-bottom, bottom-to-top combination. See T.C. Hu, "A Decomposition Algorithm for Circuit Routing," *VLSI Circuit Layout: Theory and Design,* pp. 144-152 IEEE Press (1985). Still others have focused on the area of greatest density, but have not provided any deterministic method of automatically selecting the area of greatest density, nor provided a hierarchical method of partitioning.

SUMMARY OF THE INVENTION

The method of the present invention utilizes a multidimensional binary tree data structure to order FROM-TO connections with respect to each other and the entire routing problem, and further provides a method to determine the natural hierarchical structure or nesting of all the required connections. The method of the present invention determines the order of highest density and begins the nesting operation at that area, thereafter working toward the areas of lesser density until the entire routing problem is complete. The resulting ordering of FROM-TO connections improves efficiency, reduces CPU time and in applications where requirements are close to critical resource limits, enables the completion of routing requirements where prior art methods may fail.

BRIEF DESCRIPTION OF THE DRAWINGS

A better understanding of the present invention can be obtained when the following detailed description of the preferred embodiments is considered in conjunction with the following drawings, in which.

Figure 1:
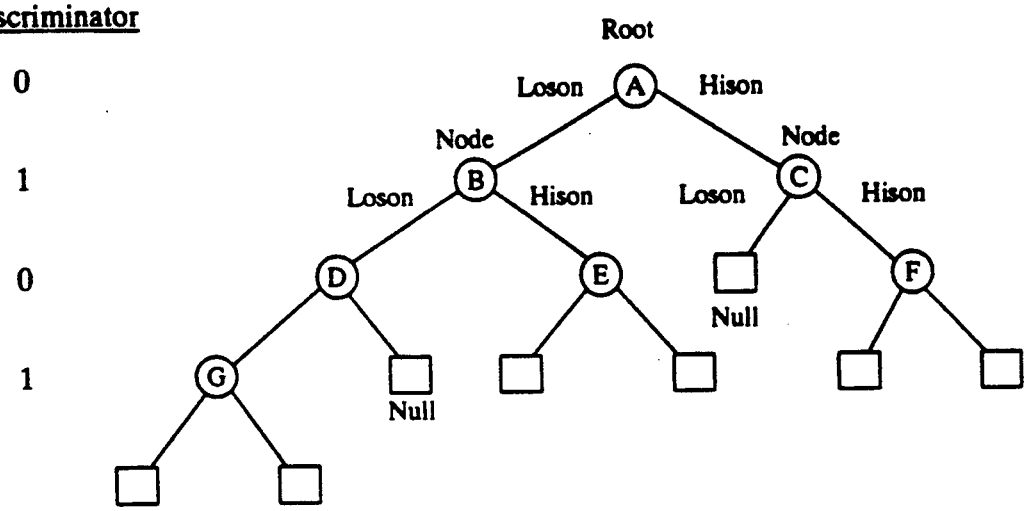
FIG. 1 is a schematic illustration of a two-dimensional binary tree data structure as shown in the prior art.

Microfiche Appendix A is an assembly code listing utilized to implement the method of the present invention on a Sun 3/60 workstation (Motorola MC 68020) computer system.

DETAILED DESCRIPTION OF THE PREFERRED EMBODIMENT

The circuit design problem can be divided into a number of subproblems: layout of the circuit elements or modules, such as a number of integrated circuit elements on the interconnect substrate, each having a number of pin-outs for connection; and routing the conductors in the substrate to properly connect all of the wiring nets on a designated wiring list. This latter problem is referred to as the "routing problem" and presupposes a given routing list of connections, typically specified in a computer data base for use with an automated routing program.

The problem specifically addressed by the present invention is the determination of the best possible ordering of routing of the individual connections, i.e., which connections are to be routed first, second, etc. The method described herein presupposes the existence of a data base including a number of X, Y terminal interconnects, net numbers and circuit boundaries dictated by physical requirements such as the size of the available routing area, etc. The present invention then provides a method for determining the best order of making the specified connections to produce a wire list or schematic utilized to produce a circuit layout mask for completion of the custom circuitry.

When automatic routing algorithms fail to route to one-hundred percent, it is usually due to areas of congestion, not because of the lack of routing resources. By starting with the areas of maximum congestion, the method of the present invention effectively nests the connections for most efficient use of routing resources with less overall meandering. By ordering the connections for routing and routing with knowledge of this order, the automatic routing is more likely to complete to one-hundred percent. The method described herein with reference to the flow charts, pseudo-code and assembly code determines a natural hierarchy within the routing problem and begins with the most difficult area of the problem. The method solves the local routing problem in the selected area before proceeding with the remainder of the connections.

The method of the present invention includes in the broadest sense a method for manufacturing a multielement integrated circuit interconnect having a number of layers, with each layer having a specified interconnection routing plan or wire list. The specified connections can be made using any suitable commercially available techniques such as additive plating of metal/conductive materials, subtractive etching of blanket metal to form specific conductive patterns, and direct writing of conductive features through photo-activated metal deposition, such as with a laser. The method encompasses: generating a net list comprising a compilation of connections to be made from specified circuit terminals to specified circuit terminals (the FROM-TO list); ordering the FROM-TO connections for routing according to density; and providing a routing plan for each selected area proceeding in the order from highest to lowest density, wherein the selected area at the highest level contains all previously selected areas.

Figure 2A:
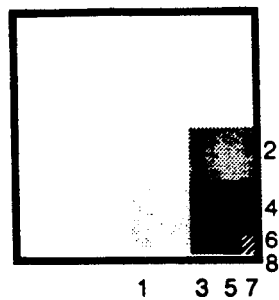
FIG. 2A is a series of nested routing rectangles defined by an ordered list of FROM-TO connections in accordance with the present invention.
Figure 2:
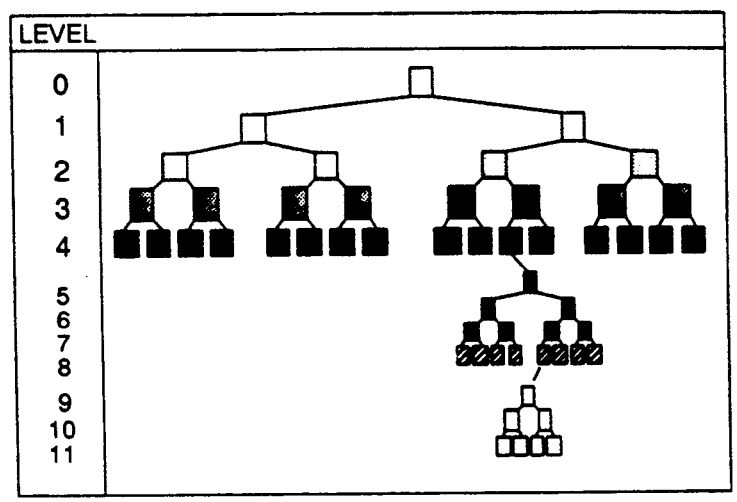
FIG. 2 is a schematic illustration of the overall approach of FROM-TO ordering according to the system of the present invention.

Referring now to FIG. 2, the general approach of the method of the present invention is illustrated. First a two-dimensional binary tree is built in which each node is a pin or terminal connecting point and at which the alternating discriminators are the X and Y coordinates of each pin. The ordered FROM-TO list is built by processing this tree from the lowest level up, searching for pins in the same net which are to be connected. When two pins in the same net are encountered, a FROM-TO is created. When the pin tree has been processed, an ordered list of FROM-TO connections has been created which defines a series of nested routing rectangles, as seen in FIG. 2A. Thereafter the automated router routes the FROM-TO list in order within the prescribed routing rectangles, attempting to solve the problem to one-hundred percent within each rectangle before proceeding to a larger rectangle.

The method of the present invention is preferably implemented on a programmable computer system having memory capacity large enough to accommodate the data base requirements and a processing speed sufficient to perform the large number of recursions in a tolerable time frame. Applicant has implemented and executed the method in a program written in C and run on a SUN 4 SPARC work station. The method is not dependent upon the particular language or hardware.

In the preferred embodiment, the method includes the generation or provision of input data files which include a pin list file including a net-list, with each pin having a net number associated with it, as well as X, Y coordinates; each pin in the same net is to be connected. Further specified is the area of the substrate or interconnect available for use in routing FROM-TO connections.

In the assembly code provided in the appendix, the input data files correspond to those required for assignees quick-turn-around-interconnect (QTAI) system. The alteration of the assembly code or data files to meet other specified applications is a matter within the ordinary skill in the art and need not be described. The result or output from the described programs comprise a map which can be translated to a set of mask generation files in an industry standard format, such as the GSDII CALMA standard, and as such can be readily used in standarized automated mask generation equipment to form a mask or overlay to carry out the prescribed routing of the interconnect. Thus, the details of the method of generating the mask data or actually implementing the interconnect routing is not described in detail.

DETAILED DESCRIPTION OF THE IMPLEMENTING SOFTWARE

Referring now to FIGS. 3 through 10, the program foreground routine and subroutines necessary to implement the method of the present invention on a suitable computer system are illustrated in schematic flow-chart form. Execution of the automatic routing procedure begins at step 100 which illustrates generally the program parameter and data file initialization process such as the identification of connection pins, X and Y coordinates, physical boundaries and other limitations to be imposed on the routing problem given the specific requirements of the circuit under consideration. Once initialized, control of the computer transfers to the BUILD FROMTO sequence which causes the computer at steps 102, 104 and 106 to sequentially set up an array of pins to be connected, sorted by reference to their X and Y coordinates; select the first discriminator, either X or Y; and find among the array the root node according to the first discriminator.

At step 102, individual arrays will be set up with reference to the variables X and Y so that two arrays will include listings of the pins sorted by X and independently sorted by Y. As referred to above, the "X" and "Y" references are to the "X" and "Y" conductors found in a typical interconnect substrate. At step 104, the instruction causes the computer to select between discriminating on the basis of the "X" or "Y" coordinate. This decision is made based on the demand of X versus the demand of Y conductor resources, so that if more Y than X conductors are required then the Y variable will be selected as the first discriminator. Otherwise the X variable will be chosen as the discriminator.

Once the discriminator is selected, control is transferred to step 106 which causes the computer to transfer control to subroutine FIND MEDIAN.

Figure 4:
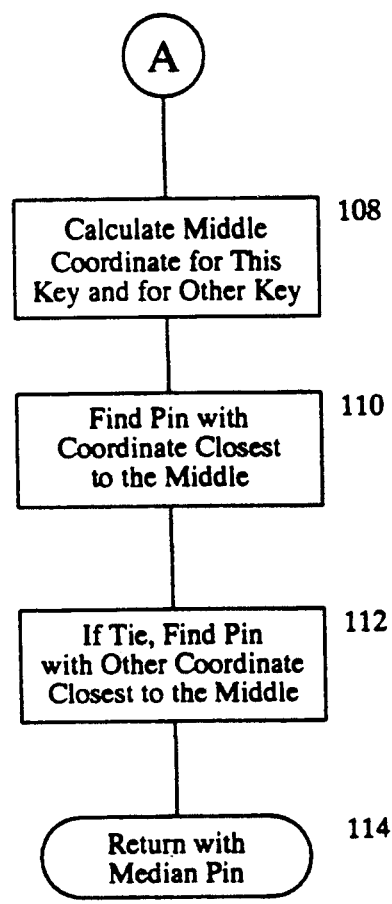
FIG. 4 is a schematic flow-chart of a portion of the system of the present invention.

Execution of the FIND MEDIAN subroutine begins at step 108 in FIG. 4. This subroutine is called with defined values for the total area available for routing, i.e., the maximum boundary, and an identification of the current discriminator, i.e., either "X" or "Y". This subroutine essentially causes the computer to determine the middle coordinate of those pins listed in the selected array by a series of recursive comparison steps set forth in detail in the assembly code contained in the appendix. Control transfers from step 108 to step 110 and ultimately to step 112, which causes the computer to determine the pin or terminal with a coordinate closest to the middle with reference to the selected discriminator and to determine ties between terminals by referring to the non-selected discriminator coordinate and selecting among the tied coordinate terminals the terminal with the non-selected coordinate closest to the middle. Thereafter control of the computer returns at step 114 to the location in the foreground routine at step 106.

Figure 5:
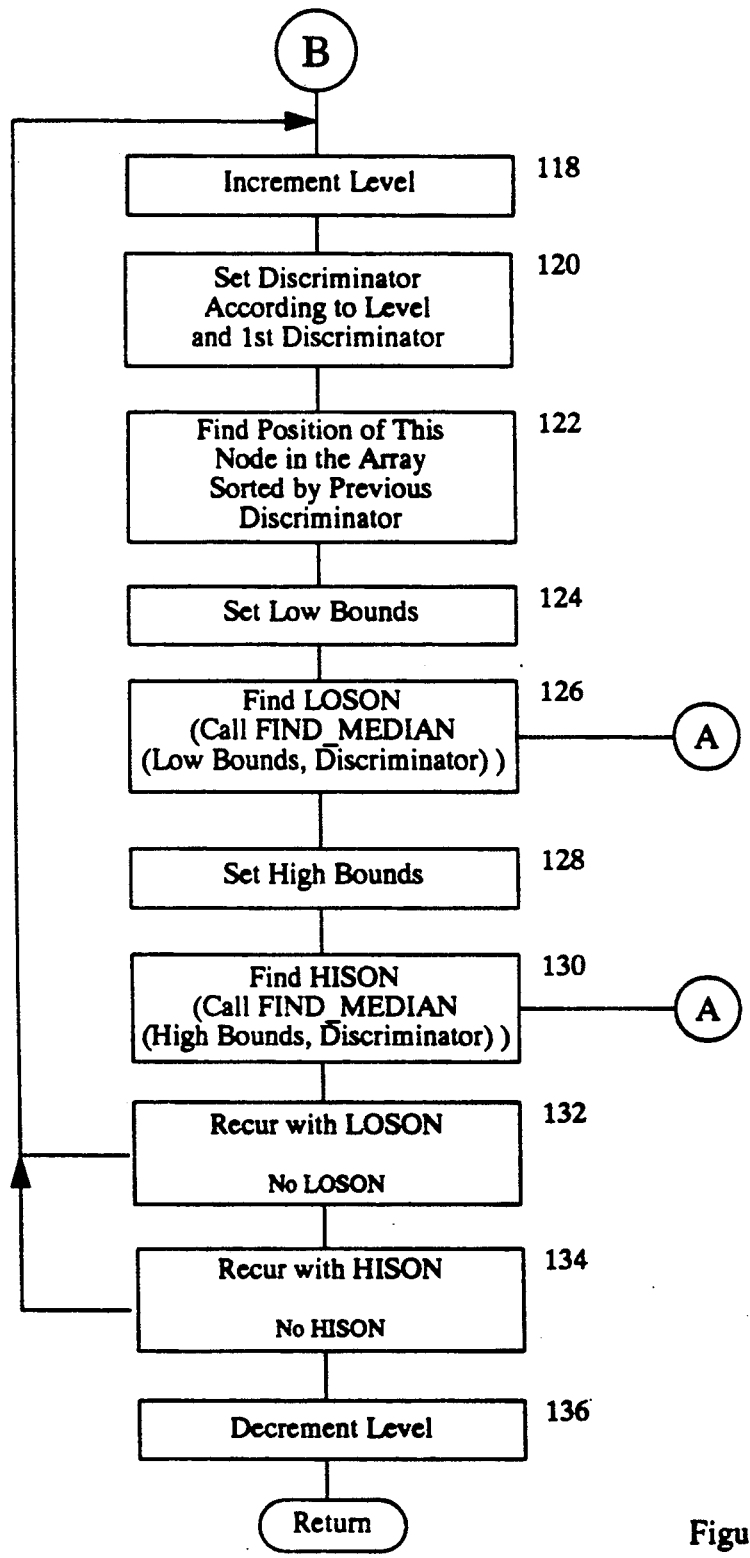
FIG. 5 is a schematic flow-chart of a portion of the system of the present invention.
Figure 6:
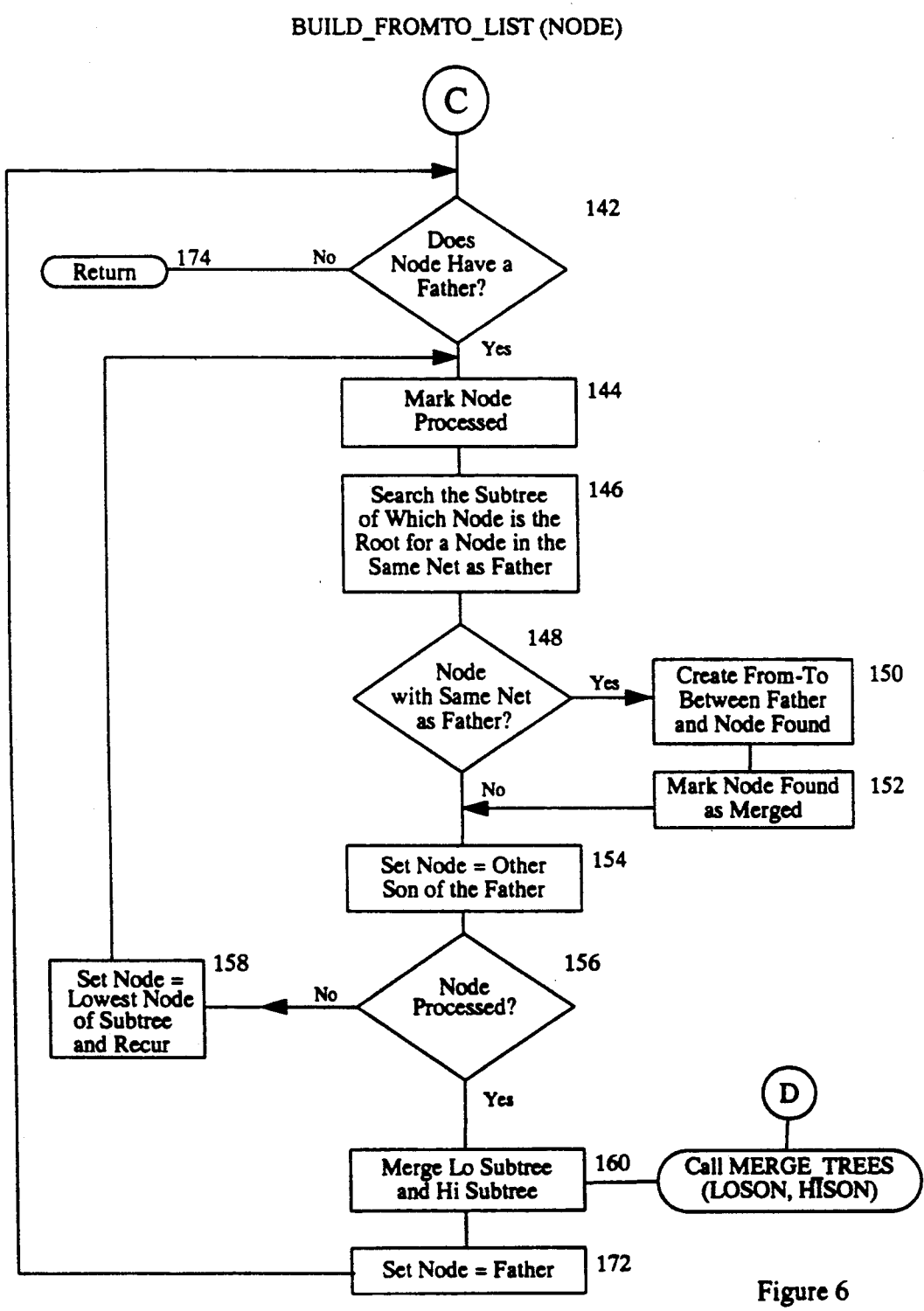
FIG. 6 is a schematic flow-chart of a portion of the system of the present invention.

Control of the computer then transfers to step 116 which calls subroutine BUILD PIN TREE (Root, Bounds). BUILD PIN TREE is essentially a recursive subroutine which causes the computer to build a binary data tree representing the various interconnect pins or terminals to completely represent the array of pins to be interconnected established earlier. Execution of BUILD PIN TREE begins at step 118 (FIG. 5). This routine is called with values for the root node, i.e., an identification of the root node found in earlier sequences, and a value for the maximum boundaries available for routing. Step 118 causes the computer to increment the variable LEVEL which corresponds to a level in the binary data structure tree to be established. The variable LEVEL corresponds to the tree level (FIG. 2) and is initialized at level 0. Step 118 causes the computer to increment the LEVEL and transfers control to step 120 which causes the computer to set the value of the discriminator according to the value of variable LEVEL and the first discriminator. Thus, if the variable discriminator was initially selected to be X which corresponds to the root node level 0, at this step the computer will set the value of discriminator to Y which would correspond to the first level.

Thereafter control of the computer transfers to step 122 which causes the computer to locate the position of the current node in the array sorted by the previously used discriminator. If the initial value of the discriminator was selected with regard to the X variable, step 122 will cause the computer to determine where the node under consideration lies in the array of pins sorted with respect to the X discriminator. This initial discriminator position is thereafter utilized in step 124 to cause the computer to define those pins in the array which have lower X values than the node under consideration to be within a defined low boundary. Thus, step 124 causes the computer to divide the pin array into an upper and a lower half defining those in the lower half to be within the low bounds and thereafter transfers control to step 126.

Figure 3:
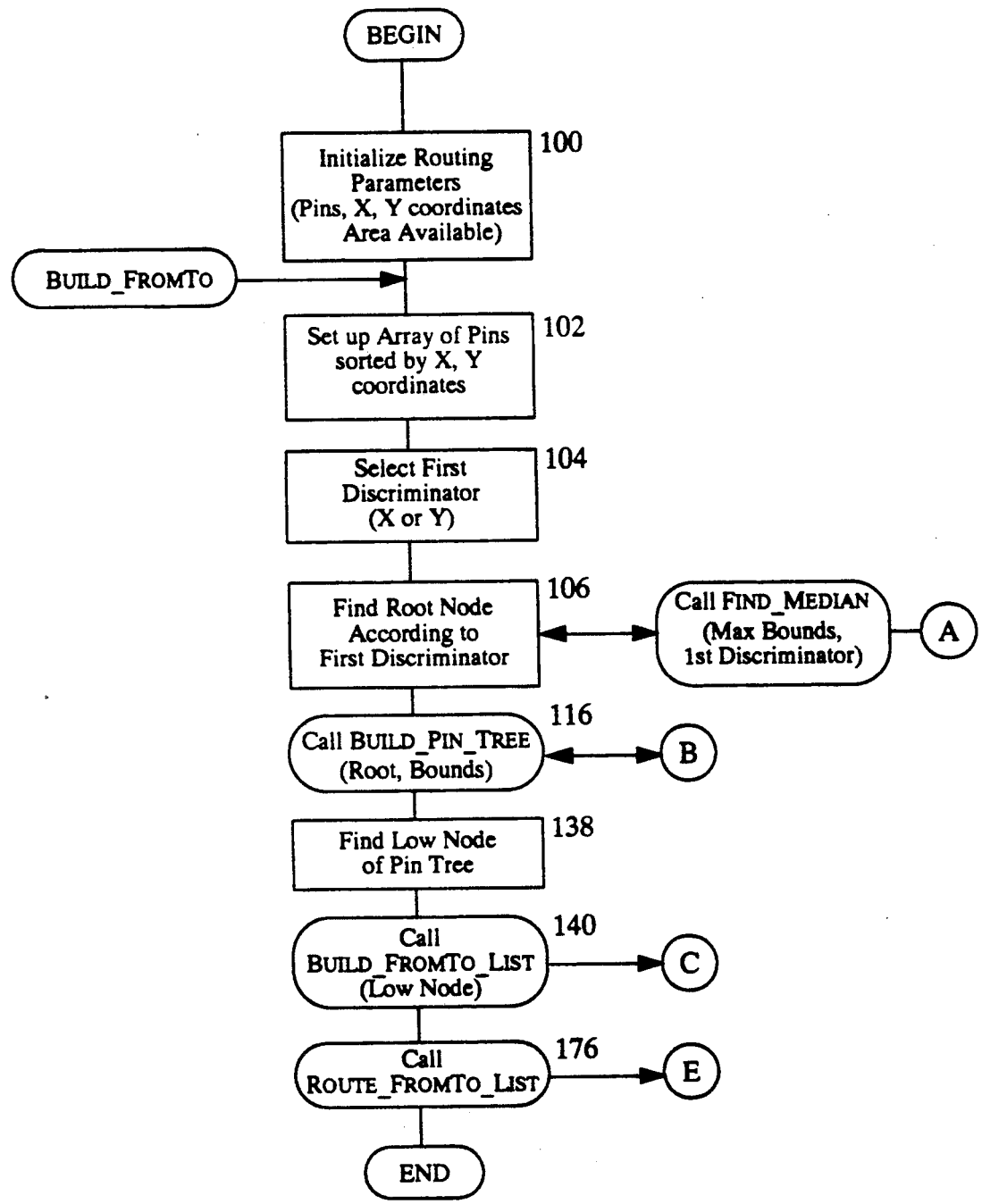
FIG. 3 is a schematic flow-chart of a portion of the system of the present invention.

Step 126 causes the computer to determine which data structure in the array under consideration comprises the LOSON of the node under consideration by execution of subroutine FIND MEDIAN (Low Bounds, Discriminator). As with the first execution of FIND MEDIAN, the subroutine shown in FIG. 4 causes the computer to divide the low boundary again by locating the median node among those in the low bounds and then returns control to step 126 in the BUILD PIN TREE routine shown in FIG. 5. Thereafter control transfers to step 128 which causes the computer to define those data structures having discriminator values higher than the root node to be within the high bounds. Thereafter control transfers to step 130 which causes the computer to determine the data structure branch which represents the HISON by again calling subroutine FIND MEDIAN. This process recurs at step 132 until all LOSON branches have been determined. Thereafter control is transferred to step 134 where a similar recurrence routine is executed to determine all HISON branches. As shown in FIG. 5, the recursive routine essentially works downward to determine all LOSON branches then decrements the tree level upward to determine the HISON branches. Once all LOSON and HISON branches have been determined, the pin tree has been completed and control is transferred to step 136, which returns control of the computer back to step 116 of the foreground routine BUILD FROMTO (FIG. 3).

Once the binary structure pin tree is completed, control of the computer is transferred from step 116 to step 138 which causes the computer to determine the low node of the constructed pin tree and transfers control to step 140. At step 140, the computer calls subroutine BUILD FROMTO LIST (low node) illustrated in FIG. 6.

The BUILD FROMTO LIST subroutine begins execution with an assigned value of the low node variable obtained from the previous steps. This subroutine builds an ordered FROM-TO list as a preparatory step to execution of the routing routine described subsequently. Execution of the BUILD FROMTO LIST subroutine begins at step 142 which causes the computer to determine whether the node, which is initially set at the low node in the previous steps, has a hierarchical father node, which at the beginning of execution will be the case. Thereafter control is transferred to step 144 which causes the computer to mark the present node as processed and transfers control to step 146.

Step 146 causes the computer to search the subtree of which the node under consideration is the root for a node in the same net as the father of the root node. Control is thereafter transferred to step 148. Step 148 causes the computer to determine whether there is in the sub tree a node having the same net as the father of the node under consideration. If so, control is transferred to step 150 which causes the computer to create a FROM-TO between the father and the node found and thereafter transfer control to step 152.

Step 152 causes the computer to mark the node found as merged with the father node and transfer control to step 154. Step 154 causes the computer to set the value of NODE equal to the other son of the father of the node initially under consideration, e.g. if in the first case the node considered is the LOSON, NODE is set to the corresponding HISON. Control is thereafter transferred to step 156 which causes the computer to determine whether the current node has been processed, and if not transfers control to step 158.

Step 158 causes the computer to set the value of the variable NODE equal to the lowest node of the subtree formed from the previous node. Whereafter, control is transferred back to step 144 to recur the previously described process. Once all nodes of the subtree have been processed, at step 156 control will be transferred to step 160.

In the preceding recursive procedure, a low subtree and a high subtree were processed and must be merged to complete this portion of the building of the FROM-TO list. Step 160 causes the computer to call and execute a subroutine MERGE TREES (LOSON, HISON).

Figure 7:
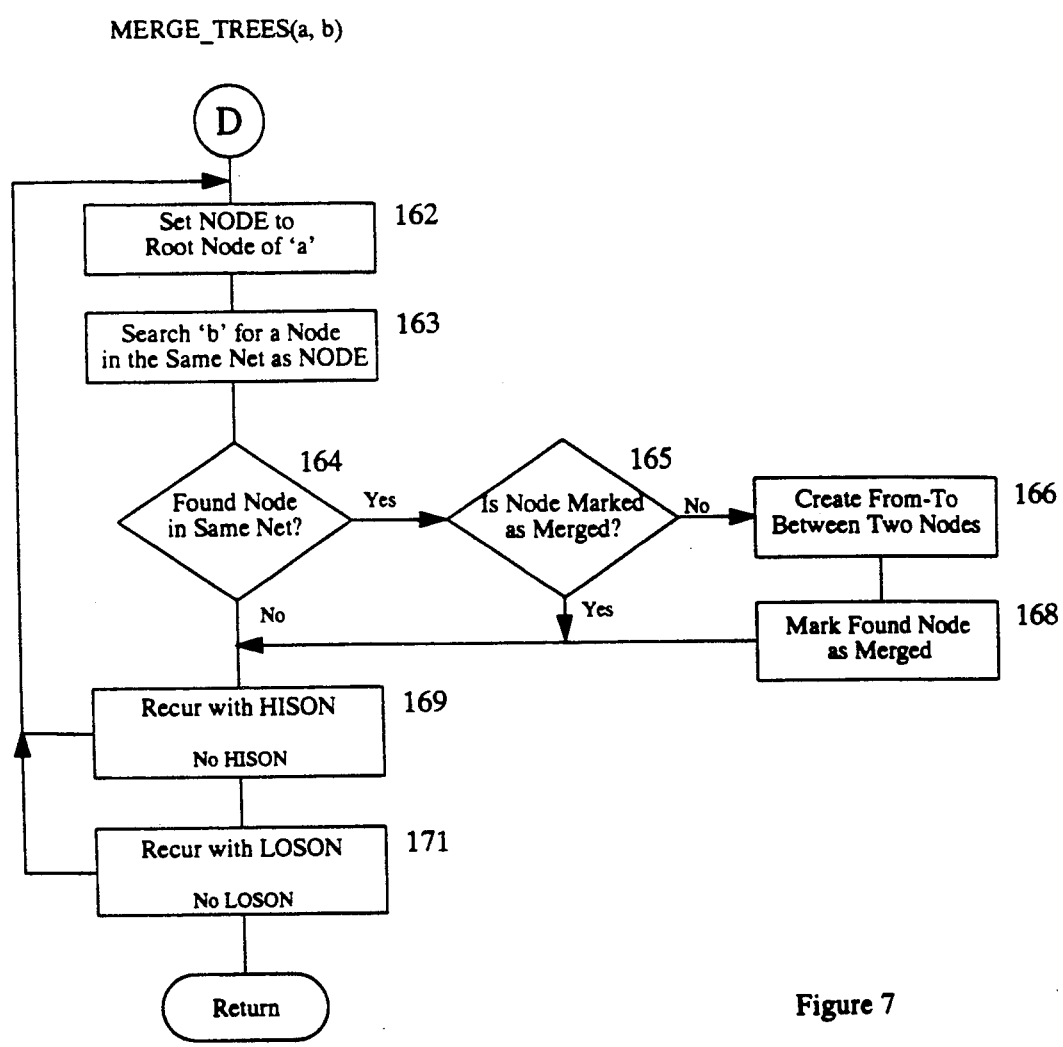
FIG. 7 is a schematic flow-chart of a portion of the system of the present invention.

Subroutine MERGE TREES is illustrated in FIG. 7. This recursive subroutine is executed to generate a connection between subnets of each subtree. Execution of the MERGE TREES subroutine begins at step 162 which sets the variable NODE to the root of the first subtree. At step 163 the computer searches the second subtree for a pin or node having a common net. Control is then transferred to step 164. If a node in the same net was located, control is transferred to step 165, and if this node has not previously been merged, to steps 166 and 168, which cause the computer to create a FROM-TO connection between the two located pins or nodes and mark the pin or node in the second subtree as having been merged. Thereafter control is transferred to steps 169 and 171 which are recursive steps which transfer control back to step 162 until such time as each pin in the first subtree has been considered and merged as possible.

Control then transfers back to the BUILD FROMTO LIST subroutine at step 160 where execution continues. After the first level of subtrees have been considered and merged, control is transferred to step 172 (FIG. 6) which causes the value of variable NODE to be set to the value of the father of the node previously considered and transfer control back to step 142 to continue processing. Step 142 causes the computer to reiterate this sequence until the BUILD FROMTO LIST is completed. When each node has been processed, the value of the variable node will be that of the root node which by definition does not have a father and control will be transfered from step 142 to return step 174.

At this point, the program of the method of the present invention has caused the computer to create an ordered list of FROM-TO connections representing the entire interconnect requirement. This ordered FROMTO LIST will be provided to the next sequence of instructions for the computer which will cause the computer to create a routing specification or wire list based upon the ordered FROMTO LIST.

When the FROMTO LIST is completed, control will be transferred to step 176 in the foreground instruction set (FIG. 3). Step 176 will cause the computer to call and execute subroutine ROUTE FROMTO LIST illustrated in FIG. 8. This subroutine is called with values for various variables associated with each FROM-TO in the FROMTO LIST, including the routing rectangle for the particular FROM-TO. For each root node, each FROM-TO connection has an associated rectangle which defines the routing area necessary to complete the FROM-TO connections.

Figure 8:
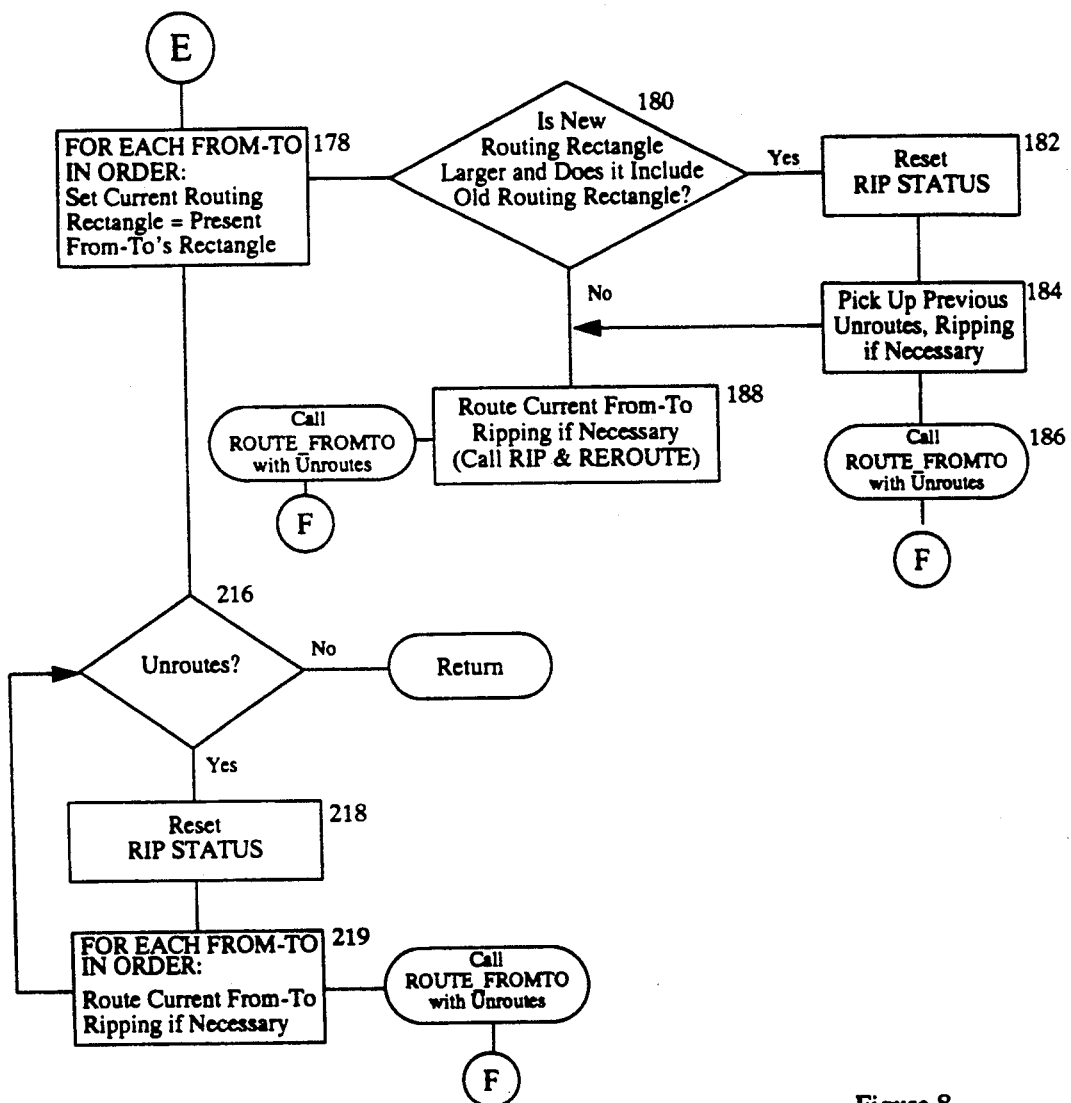
FIG. 8 is a schematic flow-chart of a portion of the system of the present invention.

Execution of the ROUTE FROMTO LIST sequence begins at step 178 which causes the computer for each FROM-TO in the FROMTO LIST in order to execute the recursive routine which is set forth in FIG. 8. Initially, the value of the variable rectangle is set to the value associated or the routing rectangle associated with the FROM-TO connection under consideration. Thereafter, control is transferred to step 180, which causes the computer to determine whether the present routing rectangle is larger and includes the routing rectangle previously set. If so, control is transferred to step 182 which resets a variable RIP STATUS whose value if set prevents ripping of previously ripped and routed connections. If at step 180 the routing rectangle is new and includes the old routing rectangle, it is an indication that the routing procedure has moved to a larger area and therefore it may be possible to complete connections which were not possible in previous attempts. Therefore, control is transferred to step 184 which causes the computer to locate any previously un-routed FROM-TO connections and attempt to complete routing of these when control is transferred to step 186.

Figure 9:
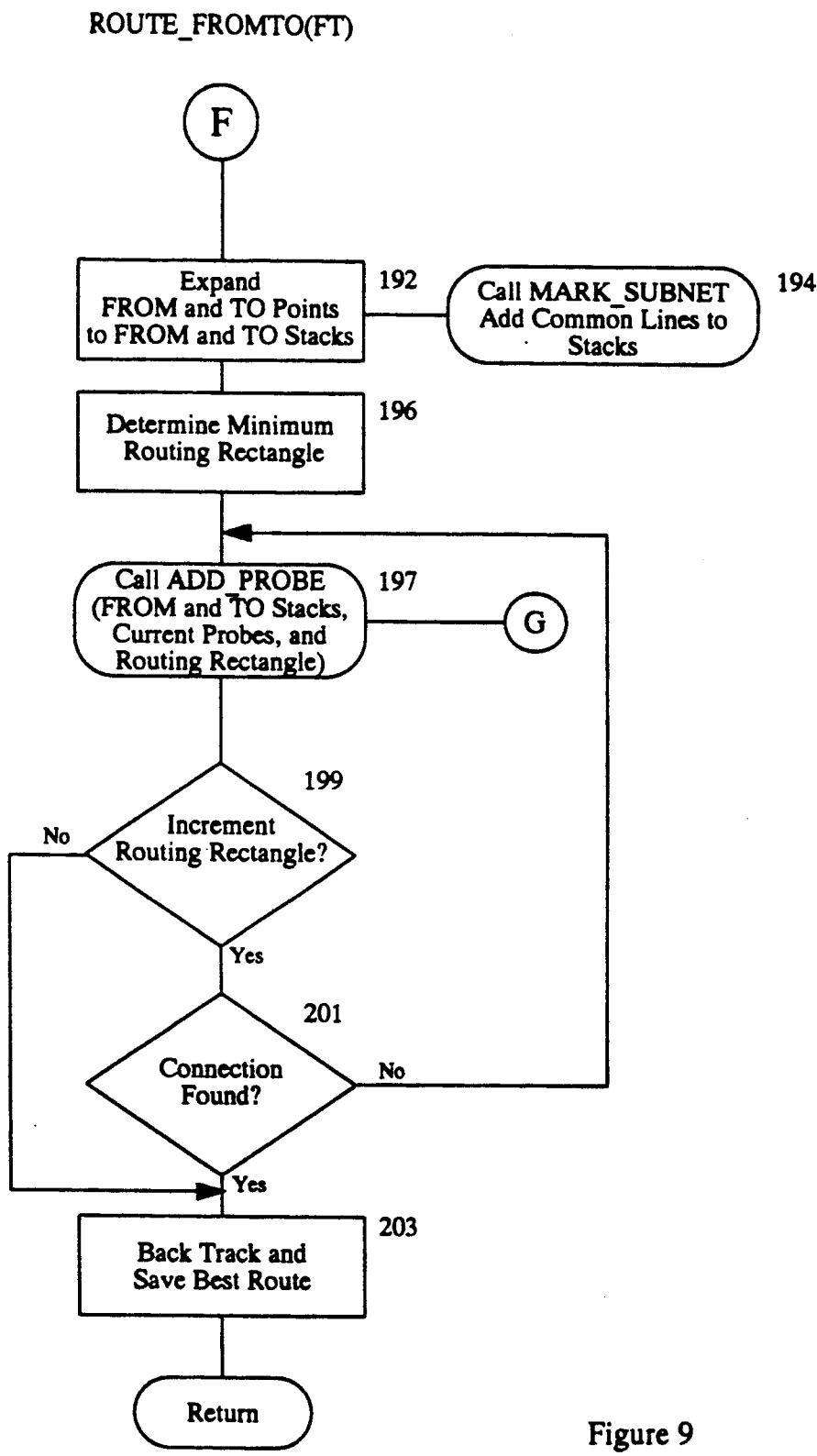
FIG. 9 is a schematic flow-chart of a portion of the system of the present invention.

Step 186 causes the computer to call and execute subroutine ROUTE FROMTO. The ROUTE FROMTO subroutine is illustrated in FIG. 9. This subroutine is a repetitive procedure which selects the best connection for the individual FROM-TO requirements. If at step 180 the computer determined that the defined routing rectangle was not new, control would have been transferred to step 188 to route the current FROM-TO connection, ripping and retrying if necessary.

Step 188 likewise causes the ROUTE FROMTO subroutine illustrated in FIG. 9 to be called and executed by the computer. ROUTE FROMTO subroutine is essentially a driver for a minimum bend, line probe automated routing sequence which operates in a specified minimum routing rectangle to determine the best available route for the specified FROM-TO connection. Step 192 (FIG. 9) causes the computer to expand FROM-TO point connections to form FROM and TO stacks, with each entry on a FROM stack being a line originating at the FROM terminal. Control is transferred at step 192 to call subroutine MARK SUBNET at step 194 which is a subroutine which causes the computer to find lines in the same net as the FROM point presently being considered, and to add those lines to the FROM STACK for the FROM point presently being considered. This step accomplishes subnet to subnet routing. See the Microfiche Appendix for details.

Figure 10:
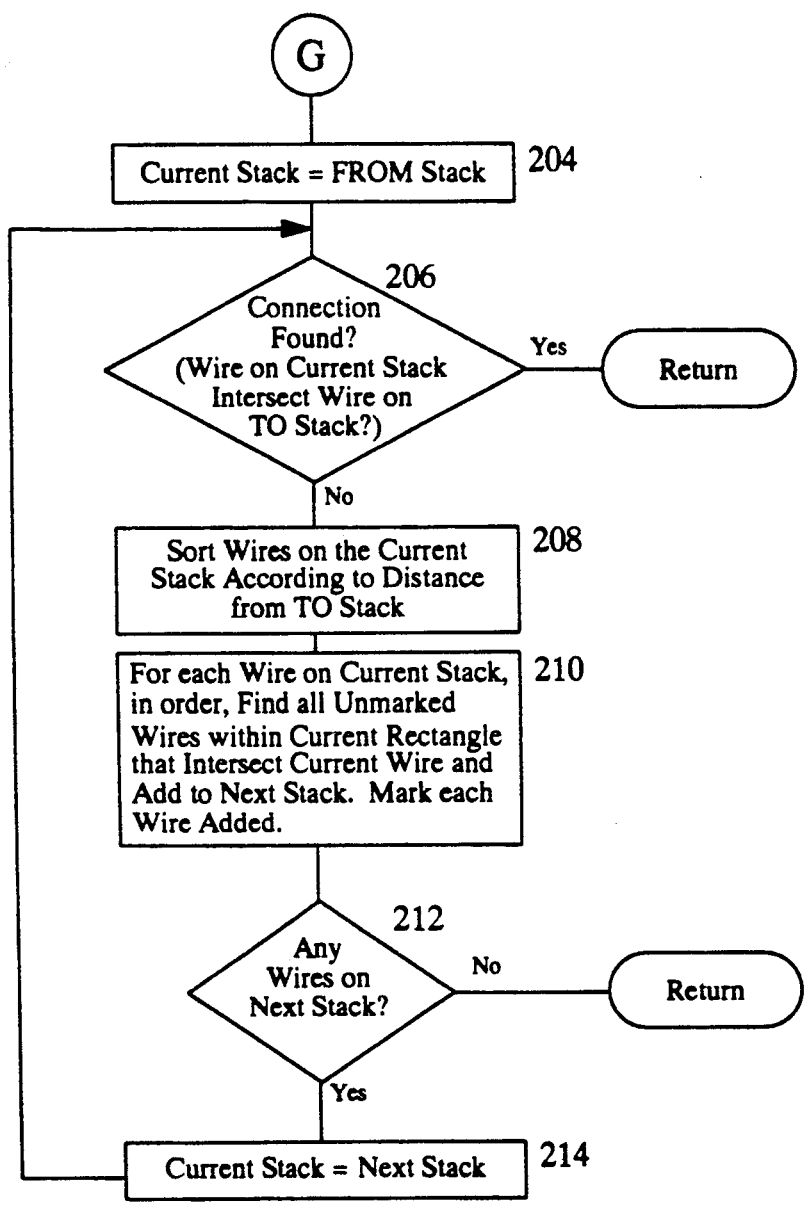
FIG. 10 is a schematic flow-chart of a portion of the system of the present invention.

Control is then transferred to step 196 which causes the computer to determine a minimum routing rectangle relating to the FROM terminal presently being considered which encompasses the two closest points of subnets between the FROM terminal and the TO terminal presently being considered. This prevents the routing program from choosing a least bend route outside the specified routing rectangle. Control is then transferred to Step 197 which causes the computer to call and execute subroutine ADD PROBE (FIG. 10).

Subroutine ADD PROBE is called and executed with values for a group of variables represented as P which includes details of the current route including FROMTO STACK references, the current routing rectangle, and the maximum rectangle. Execution of ADD PROBE begins at step 204 which sets the value of variable CURRENT STACK equal to the designator of the current FROM STACK under consideration. Control transfers thereafter to step 206 which causes the computer to determine whether a connection has been found by determining whether a wire on the current stack intersects a wire on the required TO STACK. If yes, connection has been found and control transfers out of subroutine ADD PROBE back to step 199 of FIG. 9.

If no connection is found at step 206, control transfers to step 208 which causes the computer to sort the wires on the current stack according to the distance from the TO STACK under consideration. Thereafter, control transfers to step 210, which causes the computer for each wire on the current stack in order to locate all wires that intersect it within the current rectangle and add these wires to NEXT STACK, marking each added wire to prevent repetitive adding of wires to the stack. Thereafter control is transferred to step 212 which causes the computer to determine whether or not there are any entries on NEXT STACK and if not, to return control to step 197 (FIG. 9).

If there are wires on NEXT STACK, control is transferred to step 214 which sets variable CURRENT STACK equal to NEXT STACK and returns control to step 206 to continue execution of the routing process. This sequence will recur until there are no added wires in NEXT STACK at step 212 or until a connection has been found at step 206 and control is transferred back to the ROUTE FROMTO subroutine (FIG. 9) at step 197.

Control is then transferred to step 199 where the current routing rectangle is incremented if it is not yet equal to the maximum routing rectangle as established in ROUTE-FROMTO-LIST at step 178. If the current routing rectangle is already set to the maximum, no more probing is performed and control is passed to step 203. Otherwise the rectangle is incremented and control is transferred to step 201 which causes the computer to determine whether a connection between the FROM STACK entry to the TO STACK entry under consideration has been found.

If a connection has been determined for this FROM-TO connection in previous steps, control will be transferred to step 203 which causes the computer to backtrack the connection process and save the shortest route of those satisfying the FROM-TO connection. As the computer executes these recursive routines, each FROM-TO connection is associated with an entry in the FROMTO STACK, and that connection includes a backtrack of all connections intersecting and comprising the completion of the connection. Step 203 causes the computer to evaluate each of these proposed connections and determine which is the shortest.

If at step 201 a connection has not been found for the FROM-TO connection under consideration, control is transferred to step 197 which causes the computer to continue in an effort to complete the specified FROM-TO connection.

Step 203 causes control to be returned to ROUTE-FROMTO-LIST at step 188. Control is then transferred to step 178 and the previously described steps are repeated for each FROM-TO in the FROMTO list. After the entire FROMTO list has been processed, control is passed to step 216. Step 216 determines whether or not there exist any un-routed FROM-TO connections. If not, control is transferred back to step 176 (FIG. 3) of the foreground routine whereupon execution ceases indicating completion of the routing requirement. If at step 216 there are un-routed connections, control transfers to step 218 which resets the variable RIP STATUS and transfers control to step 219 to attempt to complete the un-routes in a recursive procedure.

The foregoing description of the routing method according to the present invention is based upon the illustrated pseudo-code and flow-charts and is intended to give the overview of system logic which is executed according to assembly code contained in the appendix. The assembly code in the appendix has been compiled and executed on a Sun 3/60 workstation. The assembly code in the appendix includes details, data structures and other information necessary to implement the generalized descriptions set forth in the flow-charts in a working embodiment of the present method.

The method described in the flow-chart and assembly code listing, when implemented in a computer system and provided with prerequisite data files specifying the required FROM-TO connections, the available resources and other variables set forth in detail in the assembly code listing, will in accordance with the generalized logic set forth in the flow-chart, produce a final from-to routing list in the form of a cell map which can be translated into manufacturing data such as a GDS-2 file for utilization with automated mask work generation software in CALMA standard format which can then be utilized to generate a mask work or overlay specification also known as a wire list in accordance with the specified FROM-TO connections.

The present invention, therefore, is well adapted to carry out the objects and attain the ends and advantages mentioned as well as others inherent therein. While presently preferred embodiments of the invention have been given for the purpose of disclosure, numerous changes in the steps of the process will be readily apparent to those skilled in the art and which are encompassed within the spirit of the invention and the scope of the appended claims.

What is claimed is:

1. A method for manufacturing a routing plan for a multiple element electrical circuit interconnect substrate of the type used to interconnect a plurality of circuit element terminals comprising the steps of:
    (a) providing a net list specifying the circuit terminals to be interconnected by the interconnect substrates, said net list comprising a list of terminal connections, each with an associated net number;
    (b) generating an ordered FROM-TO list for routing according to connection density;
    (c) subdividing the area of the substrate for routing into a set of nested rectangular regions according to density;
    (d) providing an optimized routing plan for each subdivided area, proceeding from the area of highest density to lowest density; and
    (e) merging the optimized routing plans for each subdivided area to produce a routing plan for the entire interconnect substrate.

2. The method of claim 1, wherein said step of ordering the FROM-TO list comprises:
    (a) representing each entry in the net list as a NODE in a multi-dimensional binary tree data structure;
    (b) searching the binary tree data structure from the lowest level up to locate terminals in the same net;
    (c) creating a FROM-TO connection data entry for terminals having the same net; and
    (d) ordering the FROM-TO list from the lowest node in the binary tree data structure to the highest.

3. The method of claim 1 wherein said step of subdividing the area of the substrate for routing comprises defining a minimal routing rectangle necessary to route connections between the data subtrees formed below the root node of the from terminal and the to terminal under consideration for from-to routing.

4. The method of claim 1, wherein said step of providing an optimized routing plan for each subdivided area comprises determining one or more minimum bend routes for each FROM-TO connection restricted to the sub-divided area.

5. The method of claim 4, further comprising selecting the shortest minimum bend route for each FROM-TO connection from among the determined minimum bend routes.

6. The method of claim 1, wherein said step of merging the routing plans for sub-divided areas comprises:
    (a) for each node in a first data sub-tree search a second sub-tree for a node in the same net; and
    (b) if a common net between nodes is found, create a FROM-TO connection between nodes and mark the nodes as merged.

* * * * *